United States Patent
Saitou

(10) Patent No.: US 12,424,570 B2
(45) Date of Patent: Sep. 23, 2025

(54) SEMICONDUCTOR DEVICE

(71) Applicant: Sumitomo Electric Device Innovations, Inc., Yokohama (JP)

(72) Inventor: Ayuhiko Saitou, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 364 days.

(21) Appl. No.: 17/916,858

(22) PCT Filed: Sep. 7, 2021

(86) PCT No.: PCT/JP2021/032825
§ 371 (c)(1),
(2) Date: Oct. 4, 2022

(87) PCT Pub. No.: WO2022/050422
PCT Pub. Date: Mar. 10, 2022

(65) Prior Publication Data
US 2023/0163085 A1    May 25, 2023

(30) Foreign Application Priority Data
Sep. 7, 2020 (JP) .................. 2020-149904

(51) Int. Cl.
*H01L 23/00* (2006.01)
*H01L 23/66* (2006.01)
(Continued)

(52) U.S. Cl.
CPC .............. *H01L 23/66* (2013.01); *H01L 24/05* (2013.01); *H01L 24/06* (2013.01); *H01L 24/48* (2013.01);
(Continued)

(58) Field of Classification Search
CPC ......... H01L 23/66; H01L 24/05; H01L 24/06; H01L 24/48; H01L 24/49; H01L 25/16;
(Continued)

(56) References Cited

U.S. PATENT DOCUMENTS

2007/0278516 A1    12/2007  Hashimoto et al.
2009/0267214 A1*   10/2009  Kumazawa ....... H01L 23/49575
                                                  257/E23.141
(Continued)

FOREIGN PATENT DOCUMENTS

CN    104851862 A    8/2015
JP    63-086904 A    4/1988
(Continued)

OTHER PUBLICATIONS

Wang Wei et.al., "Micro-Assembly Technology of Electronic Circuits", Semiconductor Technology, 1992.6, No. 3, Jun. 29, 1992, p. 24-p. 35.
(Continued)

*Primary Examiner* — Elias Ullah
(74) *Attorney, Agent, or Firm* — Volpe Koenig

(57) ABSTRACT

A semiconductor device according to one embodiment includes: a semiconductor chip having a transistor and a drain pad provided on a board; a capacitor having an upper electrode and a lower electrode interposing a dielectric; a pad; and an empty pad provided on the board of the semiconductor chip. The semiconductor device further includes: a first wire connecting the pad and the drain pad of the semiconductor chip to each other, a second wire connecting the empty pad and the upper electrode of the capacitor to each other, and a third wire connecting the pad and the empty pad to each other.

9 Claims, 11 Drawing Sheets

(51) Int. Cl.
*H01L 25/16* (2023.01)
*H01L 23/498* (2006.01)

(52) U.S. Cl.
CPC ............... *H01L 24/49* (2013.01); *H01L 25/16* (2013.01); *H01L 23/49838* (2013.01); *H01L 2223/6611* (2013.01); *H01L 2223/6661* (2013.01); *H01L 2224/05644* (2013.01); *H01L 2224/05686* (2013.01); *H01L 2224/0603* (2013.01); *H01L 2224/06155* (2013.01); *H01L 2224/06181* (2013.01); *H01L 2224/48091* (2013.01); *H01L 2224/48095* (2013.01); *H01L 2224/48101* (2013.01); *H01L 2224/48157* (2013.01); *H01L 2224/48195* (2013.01); *H01L 2224/4903* (2013.01); *H01L 2224/49111* (2013.01); *H01L 2224/49112* (2013.01); *H01L 2224/49113* (2013.01); *H01L 2224/49175* (2013.01); *H01L 2924/0521* (2013.01); *H01L 2924/10272* (2013.01); *H01L 2924/13064* (2013.01); *H01L 2924/19041* (2013.01); *H01L 2924/19051* (2013.01); *H01L 2924/19105* (2013.01)

(58) Field of Classification Search
CPC ....... H01L 23/49838; H01L 2223/6611; H01L 2223/6661; H01L 2224/05644; H01L 2224/05686; H01L 2224/0603; H01L 2224/06155; H01L 2224/06181; H01L 2224/48091; H01L 2224/48095; H01L 2224/48101; H01L 2224/48157; H01L 2224/48195; H01L 2224/4903; H01L 2224/49111; H01L 2224/49112; H01L 2224/49113; H01L 2224/49175; H01L 2924/0521; H01L 2924/10272; H01L 2924/13064; H01L 2924/19041; H01L 2924/19051; H01L 2924/19105; H01L 23/5386; H01L 2223/6655; H01L 24/45; H01L 21/60

See application file for complete search history.

(56) References Cited

U.S. PATENT DOCUMENTS

| | | |
|---|---|---|
| 2015/0214905 A1 | 7/2015 | Miyazawa et al. |
| 2015/0237731 A1 | 8/2015 | Toyama et al. |
| 2020/0076378 A1 | 3/2020 | Minami et al. |

FOREIGN PATENT DOCUMENTS

| | | |
|---|---|---|
| JP | 04-315405 A | 11/1992 |
| JP | 08-195411 A | 7/1996 |
| JP | 2001-284395 A | 10/2001 |
| JP | 2010-186892 A | 8/2010 |
| JP | 2012-235164 A | 11/2012 |
| JP | 2015-139207 A | 7/2015 |
| JP | 2020-014377 A | 1/2020 |
| JP | 2020-036153 A | 3/2020 |

OTHER PUBLICATIONS

Zeng, Z et al., "IEEE Journal of Emerging and Selected Topics in Power Electronics, vol. 7, No. 3", Modeling and Analysis of a New Pressure Contact Package for High-Current Large-Die IGBTs, Aug. 16, 2019, p. 1615-p. 1626.

* cited by examiner

SEMICONDUCTOR DEVICE

TECHNICAL FIELD

The present disclosure relates to a semiconductor device.

This application is based upon and claims the benefit of priority from Japanese Patent Application No. 2020-149904, filed on Sep. 7, 2020, the entire contents of which are incorporated herein by reference.

BACKGROUND ART

Patent Document 1 describes an internally matched high-output field effect transistor (internally matched FET). The internally matched FET includes two GaAs FET chips arranged in an enclosure and an alumina board for an input/output matching circuit. The internally matched FET includes an input-side alumina board and an output-side alumina board. A matching circuit for impedance matching is provided on each of the input-side alumina board and the output-side alumina board.

CITATION LIST

Patent Literature

Patent Literature 1: Japanese Unexamined Patent Publication No. S63-86904

SUMMARY OF INVENTION

A semiconductor device according to one embodiment includes: a semiconductor chip having a transistor and an electrode pad provided on a board; a capacitor having an upper electrode and a lower electrode interposing a dielectric; a first relay pad; and a second relay pad provided on the board of the semiconductor chip. The semiconductor device further includes: a first wire connecting the first relay pad and the electrode pad of the semiconductor chip to each other; a second wire connecting the second relay pad and the upper electrode of the capacitor to each other; and a third wire connecting the first relay pad and the second relay pad to each other.

DESCRIPTION OF EMBODIMENTS

Figure 1:
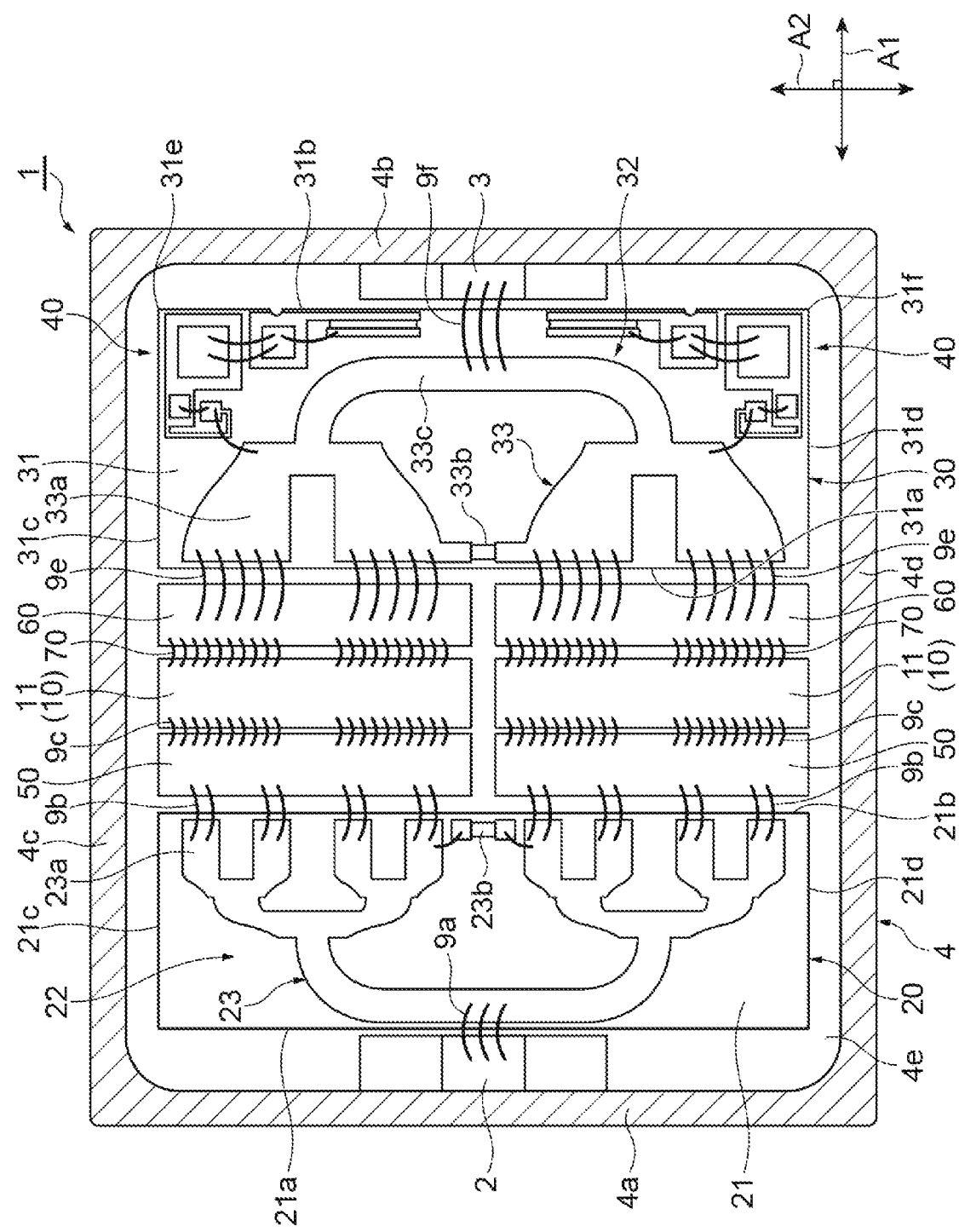
FIG. 1 is a plan view illustrating an internal configuration of a semiconductor device according to an embodiment.

In an internally matched FET of the related art, a GaAs FET chip and a matching circuit are connected to each other by a bonding wire. By the way, in a case where a frequency of a signal processed in a high-frequency amplifier is low, it may be required to reduce the number of wires connected to electrode pads of a semiconductor chip such as a drain pad and to increase a wire length of each wire. In a case where a current per wire is large and the wire length is long, there is a concern that the wire may be fused.

An object of the present disclosure is to provide a semiconductor device capable of shortening a wire connected to an electrode pad of a semiconductor chip.

DESCRIPTION OF EMBODIMENTS OF PRESENT DISCLOSURE

First, details of the embodiments of the present disclosure will be illustrated and described. A semiconductor device according to one embodiment includes: a semiconductor chip having a transistor and an electrode pad provided on a board; a capacitor having an upper electrode and a lower electrode interposing a dielectric; a first relay pad; and a second relay pad provided on the board of the semiconductor chip. The semiconductor device further includes: a first wire connecting the first relay pad and the electrode pad of the semiconductor chip to each other; a second wire connecting the second relay pad and the upper electrode of the capacitor to each other; and a third wire connecting the first relay pad and the second relay pad to each other.

In the semiconductor device, the semiconductor chip includes the transistor and the electrode pad on the board, and the capacitor includes the upper electrode and the lower electrode interposing the dielectric. The first wire connects the electrode pad of the semiconductor chip and the first relay pad to each other. The third wire connects the first relay pad and the second relay pad to each other. The second wire connects the second relay pad and the upper electrode of the capacitor to each other. Therefore, the semiconductor chip and the capacitor are connected to each other via the first wire extending from the semiconductor chip, the first relay pad, the third wire, the second relay pad on the semiconductor chip, and the second wire extending toward the capacitor. Therefore, since the first wire, the first relay pad, the third wire, the second relay pad, and the second wire are provided, only the first wire the wire connected to the electrode pad of the semiconductor chip can be used as only the first wire. Since the wires are connected to each other via the first relay pad and the second relay pad, each wire can be shortened.

The first relay pad may be arranged at a position separated from the upper electrode on the dielectric of the capacitor. The second relay pad may be arranged along one side of the semiconductor chip. In this case, the first relay pad can be arranged on the dielectric of the capacitor, and the second relay pad can be arranged along one side of the semiconductor chip facing the capacitor.

The electrode pads may be arranged along one side of the semiconductor chip. The second relay pad may be arranged adjacent to the electrode pad. In this case, the electrode pads and the second relay pad on the semiconductor chip can be arranged so as to be aligned along one side of the semiconductor chip facing the capacitor.

The semiconductor device described above may include a plurality of first relay pads aligned along one side of the capacitor and a plurality of second relay pads and a plurality of electrode pads aligned along one side of the semiconductor chip. Each of the plurality of second relay pads may be arranged adjacent to the electrode pads. In this case, the plurality of first relay pads can be aligned along one side of the capacitor facing the semiconductor chip, and the electrode pads and the second relay pads can be aligned along one side of the semiconductor chip facing the capacitor.

The semiconductor device described above may include a plurality of first wires and a plurality of second wires, and each of the plurality of first wires adjacent to each other may be connected to the common first relay pad. Each of the plurality of second wires adjacent to each other may be connected to the common second relay pad. In this case, since a plurality of line wires are connected to each of the first relay pads and the second relay pad, the first relay pad and the second relay pad can be more effectively used as the wire connecting portion.

The semiconductor device described above may include a back surface electrode provided on the back surface of the dielectric of the capacitor in a region other than a region facing the first relay pad. In this case, since the back surface electrode is not provided on the back surface of the first relay pad, the parasitic capacitance generated in the first relay pad can be suppressed.

The semiconductor device described above may include a back surface electrode provided on the back surface of the semiconductor chip or the back surface of the board in a region other than a region facing the second relay pad. In this case, since the back surface electrode is not provided on the back surface of the second relay pad, the parasitic capacitance generated in the second relay pad can be suppressed.

The first relay pad may be provided between the capacitor and the semiconductor chip. In this case, the first relay pad can be arranged at a location separated from both the capacitor and the semiconductor chip.

The board may be made of silicon carbide (SiC), diamond, or metal. In this case, the board can be made of a material having high heat dissipation.

DETAILS OF EMBODIMENTS OF PRESENT DISCLOSURE

Specific examples of the semiconductor device of the present disclosure will be described below with reference to the drawings. It is noted that the present invention is not limited to the following examples, but the present invention is illustrated in the claims and is intended to include all modified examples within the scope of the claims. In the description of the drawings, the same or corresponding elements are designated by the same reference numerals, and duplicated descriptions will be omitted as appropriate. The drawings are partially simplified or exaggerated for better understanding, and dimensional ratios and the like are not limited to those described in the drawings.

FIG. 1 is a diagram illustrating an internal configuration of a semiconductor device 1 according to an embodiment. As illustrated in FIG. 1, the semiconductor device 1 includes an input terminal 2, an output terminal 3, a semiconductor chip 10, a branch circuit board 20, a synthesizing circuit board 30, a filter circuit 40, a capacitor 50, and a capacitor 60. The semiconductor device 1 includes, for example, two filter circuits 40 and two capacitors 50 and 60.

For example, the semiconductor chip 10 is an amplifying element unit including two amplifying elements 11. As an example, a power per the amplifying element 11 is 30 W, and a power of the entire semiconductor chip 10 is 60 W. The semiconductor device 1 is, for example, a high-frequency amplifier including a package 4. The package 4 accommodates the semiconductor chip 10, the branch circuit board 20, the synthesizing circuit board 30, the filter circuit 40, and the capacitors 50 and 60.

The package 4 is made of metal and is connected to a reference potential. For example, the planar shape of the package 4 is rectangular. The package 4 has end walls 4a and 4b facing each other in a first direction A1 and side walls 4c and 4d facing each other in a second direction A2. The first direction A1 and the second direction A2 intersect each other and, as an example, are perpendicular to each other. The package 4 has a rectangular flat bottom plate 4e.

The bottom plate 4e has, for example, a plane extending in both the first direction A1 and the second direction A2. The end walls 4a and 4b are erected along a pair of sides (sides extending along the second direction A2) of the bottom plate 4e. The side walls 4c and 4d are erected along another pair of sides (sides extending along the first direction A1) of the bottom plate 4e. The package 4 further has a lid portion (not illustrated). The lid portion seals the opening formed by the end walls 4a and 4b and the side walls 4c and 4d.

The input terminal 2 is a metal wiring pattern, and a high-frequency signal is input from the outside of the semiconductor device 1. The high-frequency signal is, for example, a signal based on a multi-carrier transmission system and is formed by superposing a plurality of signals having different carrier signal frequencies. The frequency band of the carrier signal is, for example, 500 MHz or less. The input terminal 2 is provided in the central portion of the end wall 4a in the second direction A2. The input terminal 2 extends from the outside to the inside of the package 4.

For example, the semiconductor chip 10 is arranged on the bottom plate 4e of the package 4 and in a region including the center of the package 4 in the first direction A1. Each amplifying element 11 of the semiconductor chip 10 has a built-in transistor. The transistor is a field effect transistor (FET) and, for example, a high electron mobility transistor (HEMT). Each amplifying element 11 has a gate pad, a source pad, and a drain pad.

For example, the gate pads (signal input ends) and the source pads are alternately aligned on one side (end side) of the input terminal 2 side of each amplifying element 11. The drain pads (signal output ends) are aligned on the end side of the output terminal 3 side of each amplifying element 11. Each source pad is electrically connected to the bottom plate 4e of the package 4 via a via hole and has a reference potential. This via hole penetrates the amplifying element 11 in the thickness direction (for example, the direction perpendicular to the paper surface of FIG. 1). Each amplifying element 11 amplifies the high-frequency signal input to each gate pad and outputs the amplified high-frequency signal from each drain pad. The configuration of the periphery of the drain pad of the amplifying element 11 will be described in detail later.

The branch circuit board 20 is arranged on the bottom plate 4e of the package 4. The branch circuit board 20 is arranged to be aligned with the input terminal 2 and the semiconductor chip 10 along the first direction A1. The branch circuit board 20 is located between the input terminal 2 and the semiconductor chip 10. The branch circuit board 20 has a ceramic board 21 and a branch circuit 22 provided on a main surface of the board 21. For example, the planar shape of the board 21 is rectangular.

For example, one long side 21a of the branch circuit board 20 faces the input terminal 2, and the other long side 21b of the branch circuit board 20 faces the semiconductor chip 10 via the capacitor 50. The back surface of the board 21 faces the bottom plate 4e of the package 4. One short side 21c of the board 21 faces the side wall 4c of the package 4, and the other short side 21d of the board 21 faces the side wall 4d of the package 4.

The branch circuit 22 includes a wiring pattern 23 provided on the main surface of the board 21. The wiring pattern 23 is electrically connected to the input terminal 2 via a bonding wire 9a. The high-frequency signal is input to the wiring pattern 23 from the central portion of the input terminal 2 in the second direction A2 via the bonding wire 9a. The wiring pattern 23 has, for example, a shape that is line-symmetrical with respect to the center line of the board 21 along the first direction A1.

The wiring pattern 23 repeats two branches from the connection point with respect to the bonding wire 9a as a starting point and finally reaches eight metal pads 23a. The eight metal pads 23a are arranged to be aligned along the long side 21b. The metal pads 23a adjacent to each other are connected to each other via a film resistor to constitute a Wilkinson type coupler. Accordingly, the input impedance of the semiconductor chip 10 seen from the input terminal 2 is allowed to be matched while ensuring isolation between the plurality of gate pads of the semiconductor chip 10. FIG. 1 illustrates only one film resistor 23b as an example. The eight metal pads 23a are electrically connected to the capacitor 50 via a bonding wire 9b.

The capacitor 50 is arranged on the bottom plate 4e of the package 4. The capacitor 50 is arranged between the branch circuit board 20 and the semiconductor chip 10. The capacitor 50 is, for example, a parallel plate capacitor (die capacitor) and has a plurality of metal pads (not illustrated) on a main surface of the dielectric board. The number of the metal pads of the capacitor 50 is, for example, the same as the number of the metal pads 23a. The plurality of metal pads of the capacitor 50 are aligned in a row along the second direction A2. The metal pad is electrically connected to the corresponding metal pad 23a via the bonding wire 9b. The metal pad is electrically connected to the corresponding gate pad of the semiconductor chip 10 via a bonding wire 9c.

In the capacitor 50, the T-type filter circuit is configured with the inductance components by the bonding wires 9b and 9c and the capacitance of the metal pad connected between the node and the reference potential (bottom plate 4e) between the inductance components. The capacitor 50 performs impedance conversion by this T-type filter circuit. In general, in the semiconductor chip 10, the impedance in seeing inside the transistor from the gate pad is different from the characteristic impedance of a transmission line (for example, 50Ω). The capacitor 50 is a matching circuit that converts this impedance into 50Ω in seeing inside the transistor from the input terminal 2 by a T-type filter circuit.

The capacitor 60 is arranged on the bottom plate 4e of the package 4. The capacitor 60 is arranged between the semiconductor chip 10 and the synthesizing circuit board 30. Similarly to the capacitor 50, the capacitor 60 is, for example, a parallel plate capacitor (die capacitor). The capacitor 60 has an upper electrode and a lower electrode that interpose the dielectric. That is, similarly to the capacitor 50, the capacitor 60 also has a plurality of metal pads (not illustrated) on the main surface of the dielectric board.

The number of the metal pads of the capacitor 60 is, for example, the same as the number of the metal pads 23a. The plurality of metal pads of the capacitor 60 are arranged in a row along the second direction A2. The metal pad is electrically connected to the corresponding drain pad of the semiconductor chip 10 via a wire group 70 described later. The metal pad is electrically connected to a corresponding metal pad 33a of the synthesizing circuit board 30 via a bonding wire 9e. It is noted that FIG. 1 simplifies the illustration of the wire group 70.

In the capacitor 60, the T-type filter circuit is configured with the inductance components by the wire group 70 and the bonding wire 9e and the capacitance of the metal pad connected between the node and the reference potential (bottom plate 4e) between these inductance components. The capacitor 60 performs impedance conversion by this T-type filter circuit. In general, in the semiconductor chip 10, the impedance in seeing inside the transistor from the drain pad is often smaller than 50Ω unlike the characteristic impedance of a transmission line (for example, 50Ω). The capacitor 60 is a matching circuit that converts this impedance into 50Ω in seeing inside the transistor from the output terminal 3 by a T-type filter circuit.

The synthesizing circuit board 30 is arranged on the bottom plate 4e of the package 4. The synthesizing circuit board 30 is arranged to be aligned with the semiconductor chip 10 and the output terminal 3 along the first direction A1. The synthesizing circuit board 30 is located between the semiconductor chip 10 and the output terminal 3. The synthesizing circuit board 30 has a ceramic board 31 and a synthesizing board 32 provided on the main surface of the board 31. The planar shape of the board 31 is, for example, a rectangular shape.

One long side 31a of the board 31 faces the semiconductor chip 10 via the capacitor 60, and the other long side 31b of the board 31 faces the output terminal 3. The back surface of the board 31 faces the bottom plate 4e of the package 4. One short side 31c of the board 31 faces the side wall 4c of the package 4, and the other short side 31d of the board 31 faces the side wall 4d of the package 4.

The synthesizing board 32 synthesizes signals output from the plurality of drain pads of the semiconductor chip 10 into one output signal. The synthesizing board 32 includes a wiring pattern 33 provided on the main surface of the board 31. The wiring pattern 33 has, for example, a shape that is line-symmetrical with respect to the center line of the board 31 along the first direction A1. The wiring pattern 33 includes four metal pads 33a. The four metal pads 33a are arranged be aligned along the long side 31a of the board 31.

The metal pads 33a adjacent to each other are connected to each other via a film resistor to constitute a Wilkinson type coupler. Accordingly, the output impedance of the semiconductor chip 10 seen from the output terminal 3 is allowed to be matched while ensuring the isolation between the plurality of drain pads of the semiconductor chip 10. It is noted that FIG. 1 illustrates only one film resistor 33b as an example.

Each metal pad 33a is electrically connected to two corresponding metal pads of the capacitor 60 via the bonding wire 9e. The wiring pattern 33 finally reaches a connection point with a bonding wire 9f while repeating the coupling from the four metal pads 33a. The wiring pattern 33 is electrically connected to the output terminal 3 via the bonding wire 9f. An amplified high-frequency signal is output from the central portion of the board 31 in the second direction A2 to the output terminal 3.

The output terminal 3 is a metal wiring pattern. The output terminal 3 outputs the amplified high-frequency signal to the outside of the semiconductor device 1. The output terminal 3 is provided in the central portion of the end wall 4b in the second direction A2. The output terminal 3 extends from the inside of the package 4 to the outside.

For example, the semiconductor device 1 includes a pair of filter circuits 40. The filter circuit 40 is provided, for example, in order to reduce third-order intermodulation distortion included in the output signal. One filter circuit 40 is arranged between the central portion of the board 31 in the second direction A2 and the one corner portion 31e located on the opposite side of the semiconductor chip 10 in the board 31.

The other filter circuit 40 is arranged between the central portion of the board 31 in the second direction A2 and the other corner portion 31f located on the opposite side of the semiconductor chip 10 in the board 31. That is, the one filter circuit 40 is arranged at a position closer to the corner portion 31e with respect to the center of the main surface of the board 31. The other filter circuit 40 is arranged at a position closer to the corner portion 31f with respect to the center of the main surface of the board 31.

Figure 2:
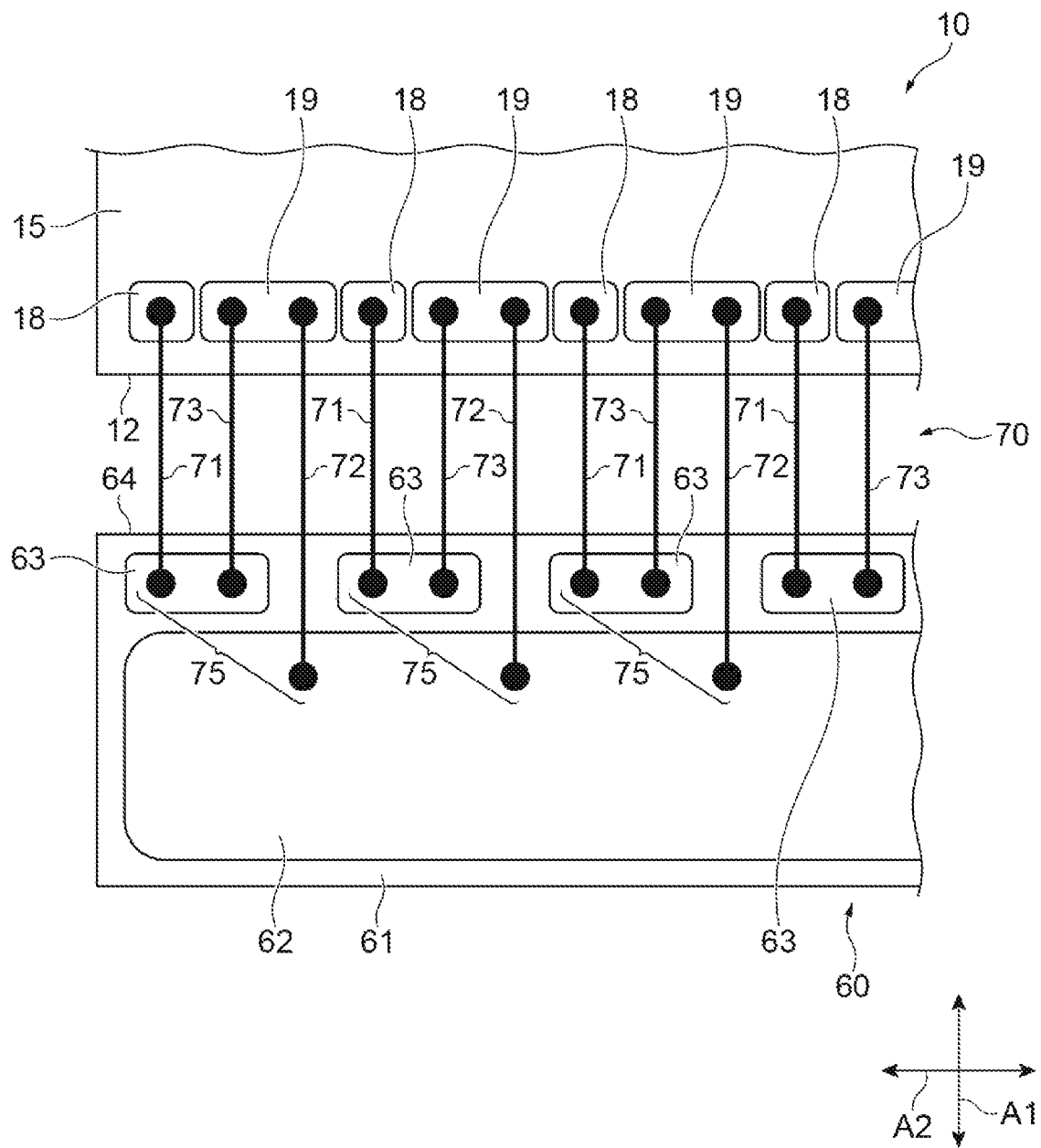
FIG. 2 is a plan view illustrating a semiconductor chip, a capacitor, and a wire of the semiconductor device of FIG. 1.

Next, the details of the semiconductor chip 10 and the capacitor 60 will be described with reference to FIG. 2. FIG. 2 is a plan view illustrating the semiconductor chip 10 and the capacitor 60. The semiconductor chip 10 has an elongated rectangular shape. The semiconductor chip 10 has a long side 12 (one side) facing the capacitor 60.

For example, the long side 12 extends along the second direction A2. The semiconductor chip 10 includes a board 15, a gate pad, an active region, a drain pad 18 (electrode pad), and an empty pad 19 (second relay pad). The board 15 has a rectangular shape having the long side 12 described above.

The semiconductor chip 10 includes, for example, a plurality of drain pads 18 and a plurality of empty pads 19. Each of the drain pad 18 and the empty pad 19 is arranged so as to be aligned along the long side 12 facing the capacitor 60. Since the semiconductor chip 10 includes the empty pad 19, the wire length of each wire of the wire group 70 can be shortened.

As described above, the capacitor 60 includes a dielectric 61, an upper electrode 62, a lower electrode (not illustrated), and a pad 63 (first relay pad). The capacitor 60 (dielectric 61) has a long side 64 (one side) facing the semiconductor chip 10. For example, the long side 64 extends along the second direction A2.

The upper electrode 62 and the pad 63 are arranged on the dielectric 61. The pad 63 is provided to be closer to the semiconductor chip 10 than the upper electrode 62 is. The dielectric 61 has a rectangular shape having the long side 64 described above. The capacitor 60 includes the plurality of pads 63. The plurality of pads 63 are provided on the semiconductor chip 10 side of the upper electrode 62. For example, the plurality of pads 63 are aligned along the long side 64. Each pad 63 has a rectangular shape with a long side extending along the second direction A2.

As described above, the semiconductor chip 10 and the capacitor 60 are electrically connected to each other via the wire group 70. The wire group 70 includes a first wire 71, a second wire 72, and a third wire 73. The first wire 71 connects the pad 63 and the drain pad 18 of the semiconductor chip 10 to each other. The second wire 72 connects the upper electrode 62 of the capacitor 60 and the empty pad 19 to each other. The third wire 73 connects the empty pad 19 and the pad 63 to each other.

For example, the first wire 71 connecting the drain pad 18 and the pad 63 to each other, the third wire 73 connecting the empty pad 19 and the pad 63 to each other, and the second wire 72 connecting the empty pad 19 and the upper electrode 62 to each other are aligned along the second direction A2 in this order. The wire length of at least one of the first wire 71, the second wire 72, and the third wire 73 is, for example, 0.6 mm. It is noted that the second wire 72 may be longer than the first wire 71 and the third wire 73.

Figure 3:
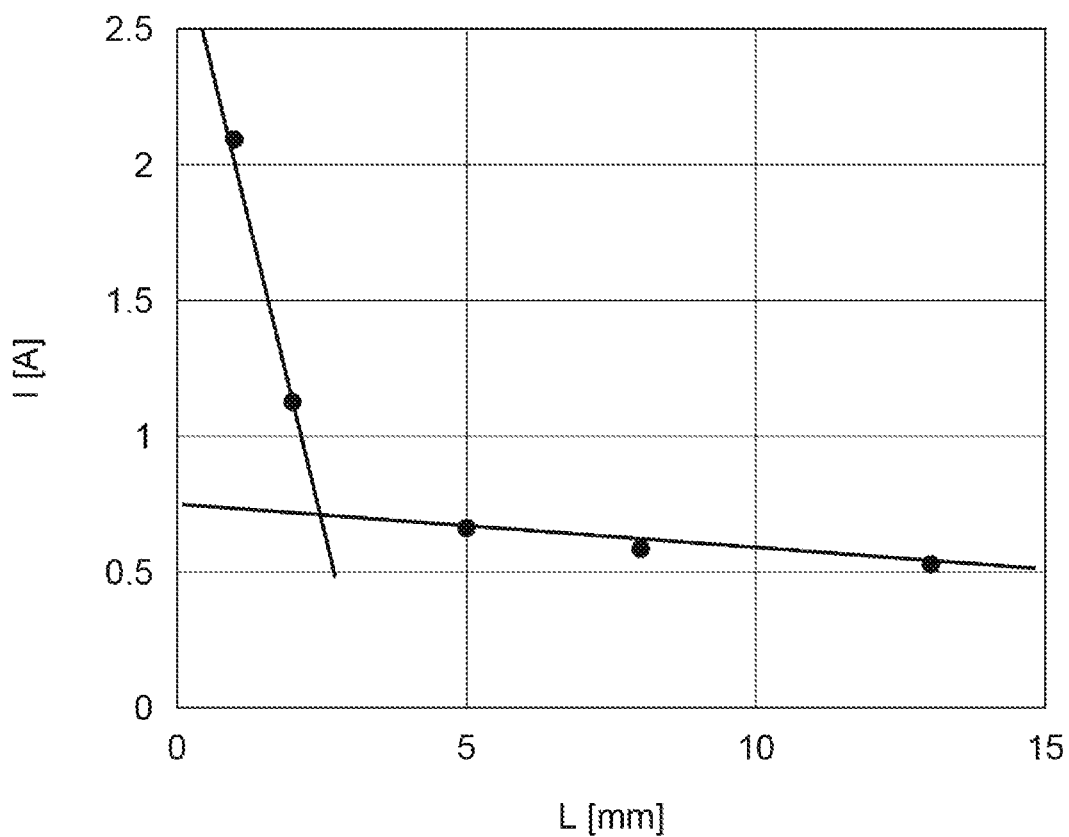
FIG. 3 is a graph illustrating an example of a relationship between a wire length and a current.

As described above, in the present embodiment, the wire group 70 connecting the semiconductor chip 10 and the capacitor 60 to each other includes the first wire 71, the second wire 72, and the third wire 73. Accordingly, it is possible to shorten the wire length of each wire constituting the wire group 70. As illustrated in FIG. 3, as a wire length (L) becomes shorter, a fusing current (I) of each wire becomes larger.

Figure 4:
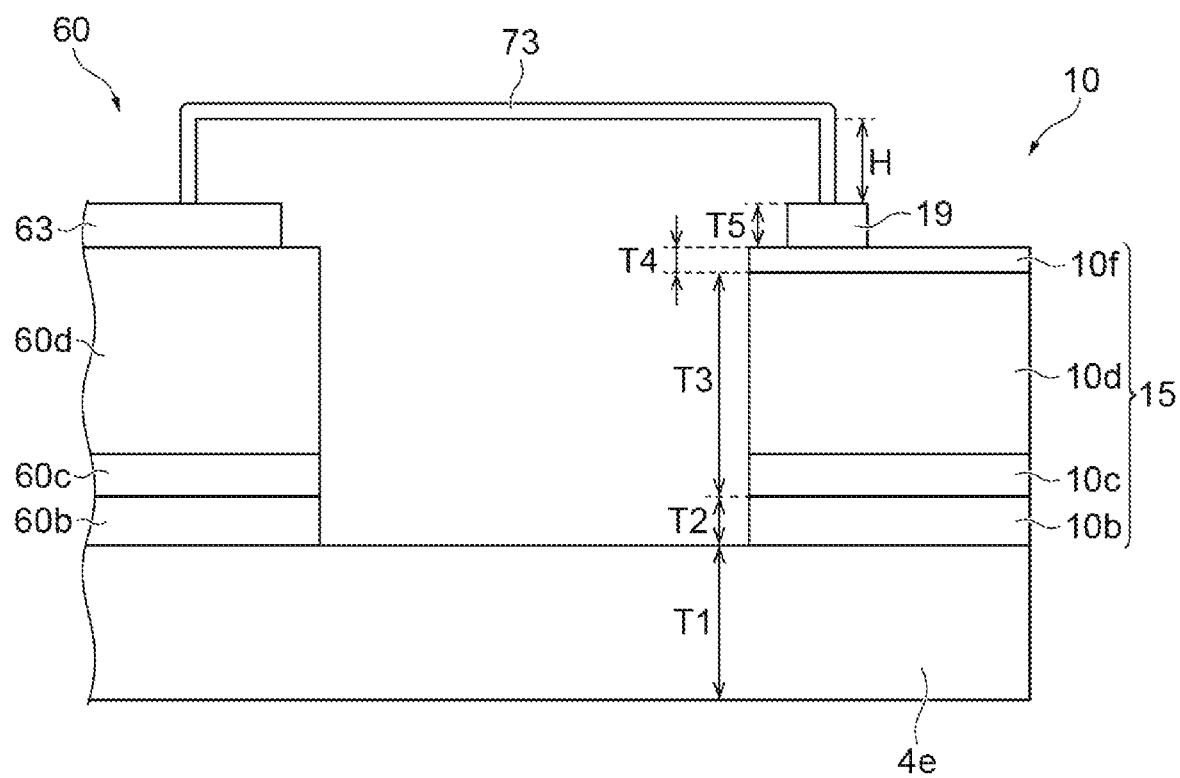
FIG. 4 is a diagram illustrating the semiconductor chip, the capacitor, and the wire of the semiconductor device of FIG. 1.

FIG. 4 is a diagram illustrating the semiconductor chip 10, the capacitor 60, and the third wire 73. As illustrated in FIG. 4, the semiconductor chip 10 includes, for example, an Ag-Player 10b, an Au layer 10c, a SiC layer 10d, and a GaN layer 10f. The semiconductor chip 10 has a configuration in which the Au layer 10c is provided on the Ag-Player 10b, the SiC layer 10d is provided on the Au layer 10c, and the GaN layer 10f is provided on the SiC layer 10d.

The empty pad 19 is provided on the GaN layer 10f. The empty pad 19 contains, for example, gold (Au). In the semiconductor chip 10, heat flows from the empty pad 19 into the SiC layer 10d via the GaN layer 10f. The heat from the wire group 70 (for example, the third wire 73) is dissipated, and the fusing of the wire group 70 due to heat generation can be suppressed. As an example, a thickness T1 of the bottom plate 4e is 1000 μm, a thickness T2 of the Ag-Player 10b is 30 μm, and a thickness T3 of the Au layer 10c and the SiC layer 10d is 100 μm. A thickness T4 of the GaN layer 10f is 0.6 μm, a thickness T5 of the empty pad 19 is 10 μm, and a height H of a rising edge of the pad 63 from the empty pad 19 is 100 μm.

For example, the board 15 of the semiconductor chip 10 includes an Ag-Player 10b, an Au layer 10c, and an SiC layer 10d. As described above, the board 15 functions as a heat dissipation plate that dissipates heat generated by the element. The board 15 is made of, for example, a material having high heat dissipation. For example, the board 15 may include a diamond layer or a metal layer together with the SiC layer 10d or in place of the SiC layer 10d. The material of the metal layer of the board 15 is, for example, a red metal material containing copper or gold or a silver-white metal material containing silver, nickel or aluminum.

The capacitor 60 includes, for example, an Ag-Player 60b, an Au layer 60c, and a ceramic layer 60d. The capacitor 60 has a configuration in which the Au layer 60c is provided on the Ag-Player 60b and the ceramic layer 60d is provided on the Au layer 60c. The pad 63 is provided on the ceramic layer 60d. The pad 63 contains, for example, gold (Au). In the capacitor 60, heat from the wire group 70 (for example, the third wire 73) is dissipated from the pad 63 to the ceramic layer 60d. As a result, it is possible to suppress the fusing of the wire group 70 due to heat generation.

Figure 5:
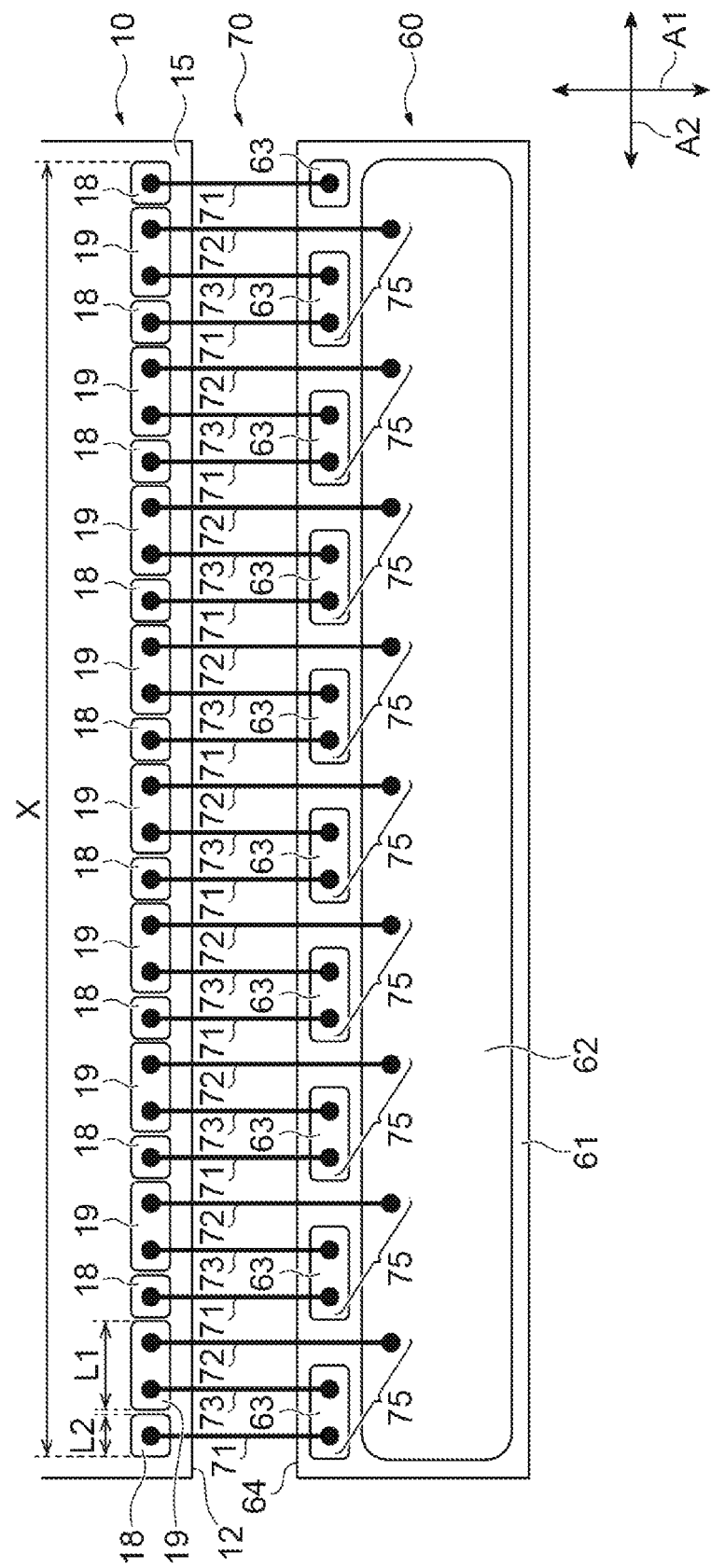
FIG. 5 is a plan view illustrating the semiconductor chip, the capacitor, and the wire of the semiconductor device of FIG. 1.

FIG. 5 is a plan view illustrating the whole of the semiconductor chip 10, the capacitor 60, and the wire group 70 illustrated in FIG. 1. As illustrated in FIG. 5, the wire group 70 includes a plurality of first wires 71, a plurality of second wires 72, and a plurality of third wires 73. The wire group 70 may include a plurality of sets 75 including the first wire 71, the second wire 72, and the third wire 73. For example, the plurality of sets 75 are aligned along the second direction A2.

For example, in each set 75, the first wire 71, the third wire 73, and the second wire 72 are arranged so as to be aligned along the second direction A2 in this order. As an example, the number of the sets 75 is nine. For example, a length L1 of the empty pad 19 in the second direction A2 is longer than a length L2 of the drain pad 18 in the second direction A2. As an example, the length L1 of the empty pad 19 is 250 μm, and the length L2 of the drain pad 18 is 150 μm. A length X from the drain pad 18 located at one end of the second direction A2 to the drain pad 18 located at the other end of the second direction A2 is 5.34 mm.

Next, the function and effect obtained from the semiconductor device 1 according to the embodiment will be described. In the semiconductor device 1, the semiconductor chip 10 includes the transistor and the drain pad 18 on the board 15. The capacitor 60 includes an upper electrode 62 and a lower electrode that interpose the dielectric 61. The first wire 71 connects the drain pad 18 of the semiconductor chip 10 and the pad 63 to each other. The third wire 73 connects the pad 63 and the empty pad 19 to each other. The second wire 72 connects the empty pad 19 and the upper electrode 62 of the capacitor 60 to each other. Therefore, the semiconductor chip 10 and the capacitor 60 are connected to each other via the first wire 71 extending from the semiconductor chip 10, the pad 63, the third wire 73, the empty pad 19 on the semiconductor chip 10, and the second wire 72 extending toward the capacitor 60.

Since the first wire 71, the pad 63, the third wire 73, the empty pad 19, and the second wire 72 are included, the wire connected to the drain pad 18 of the semiconductor chip 10 can be used as only the first wire 71. Each wire can be shortened by connecting the wires to each other via the pad 63 and the empty pad 19.

The pad 63 may be arranged at a position separated from the upper electrode 62 on the dielectric 61 of the capacitor 60. The empty pad 19 may be arranged along the long side 12 of the semiconductor chip 10. In this case, the pad 63 can be arranged on the dielectric 61 of the capacitor 60. The empty pad 19 can be arranged along the long side 12 of the semiconductor chip 10 facing the capacitor 60.

The drain pad 18 may be arranged along the long side 12 of the semiconductor chip 10, and the empty pad 19 may be arranged adjacent to the drain pad 18. In this case, the drain pads 18 and the empty pads 19 on the semiconductor chip 10 can be arranged so as to be aligned along the long side 12 of the semiconductor chip 10 facing the capacitor 60.

The semiconductor device 1 may include a plurality of pads 63 aligned along the long side 64 of the capacitor 60 and a plurality of empty pads 19 and a plurality of drain pads 18 aligned along the long side 12 of the semiconductor chip 10. Each of the plurality of empty pads 19 may be arranged adjacent to the drain pad 18. In this case, the plurality of pads 63 can be aligned along the long side 64 of the capacitor 60 facing the semiconductor chip 10, and the drain pad 18 and the empty pad 19 bare aligned along the long side 12 of the semiconductor chip 10 facing the capacitor 60.

The board 15 may be made of silicon carbide (SiC), diamond, or metal. In this case, the board 15 can be made of a material having high heat dissipation.

Figure 6:
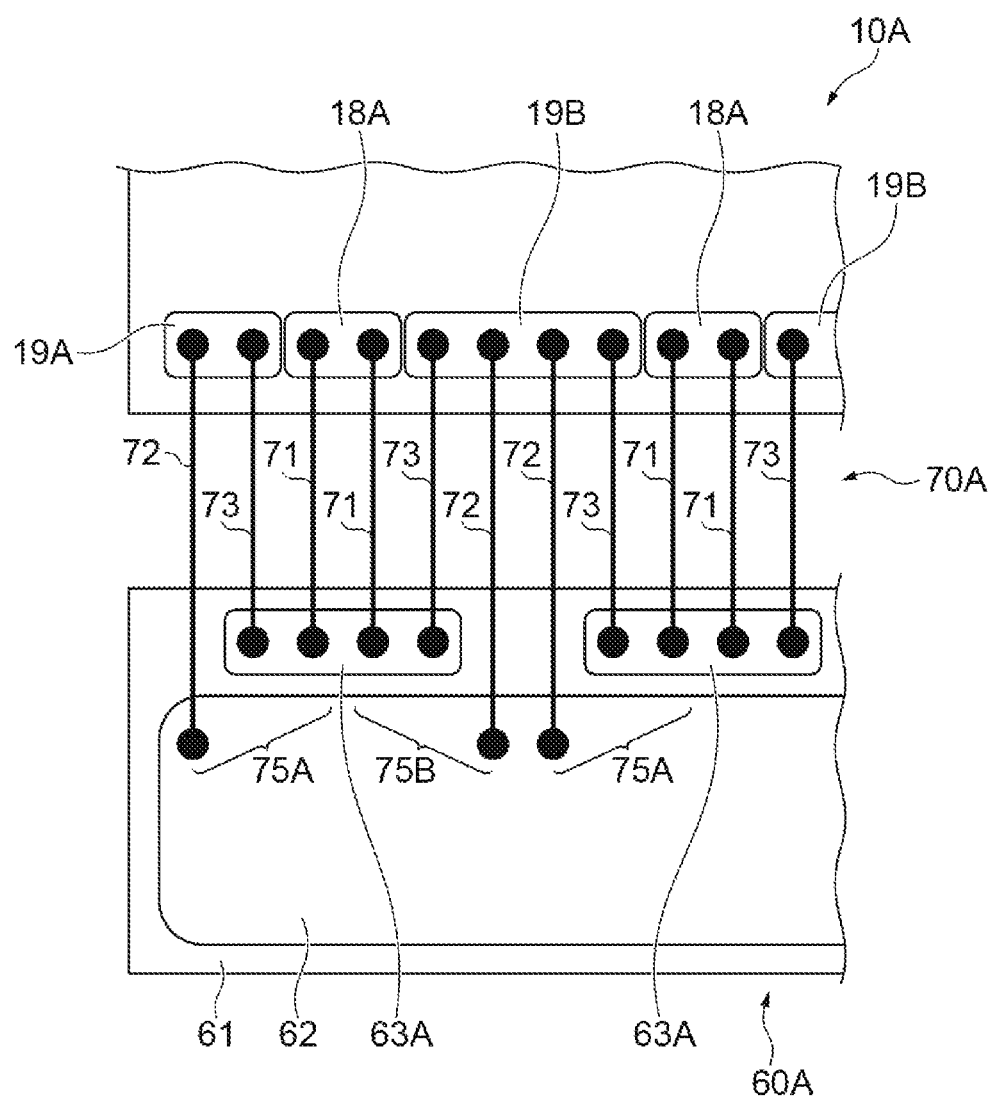
FIG. 6 is a plan view illustrating a semiconductor chip, a capacitor, and a wire of a semiconductor device according to modified example 1.

Next, a semiconductor device according to modified example 1 will be described with reference to FIG. 6. As illustrated in FIG. 6, the semiconductor device according to modified example 1 includes a drain pad 18A, an empty pad 19B, a pad 63A, and a wire group 70A. The drain pad 18A is different from the drain pad 18, and the empty pad 19B is different from the empty pad 19. The pad 63A is different from the pad 63, and the wire group 70A is different from the wire group 70. Hereinafter, the description overlapping the description of the semiconductor device 1 described above will be omitted as appropriate.

Figure 7:
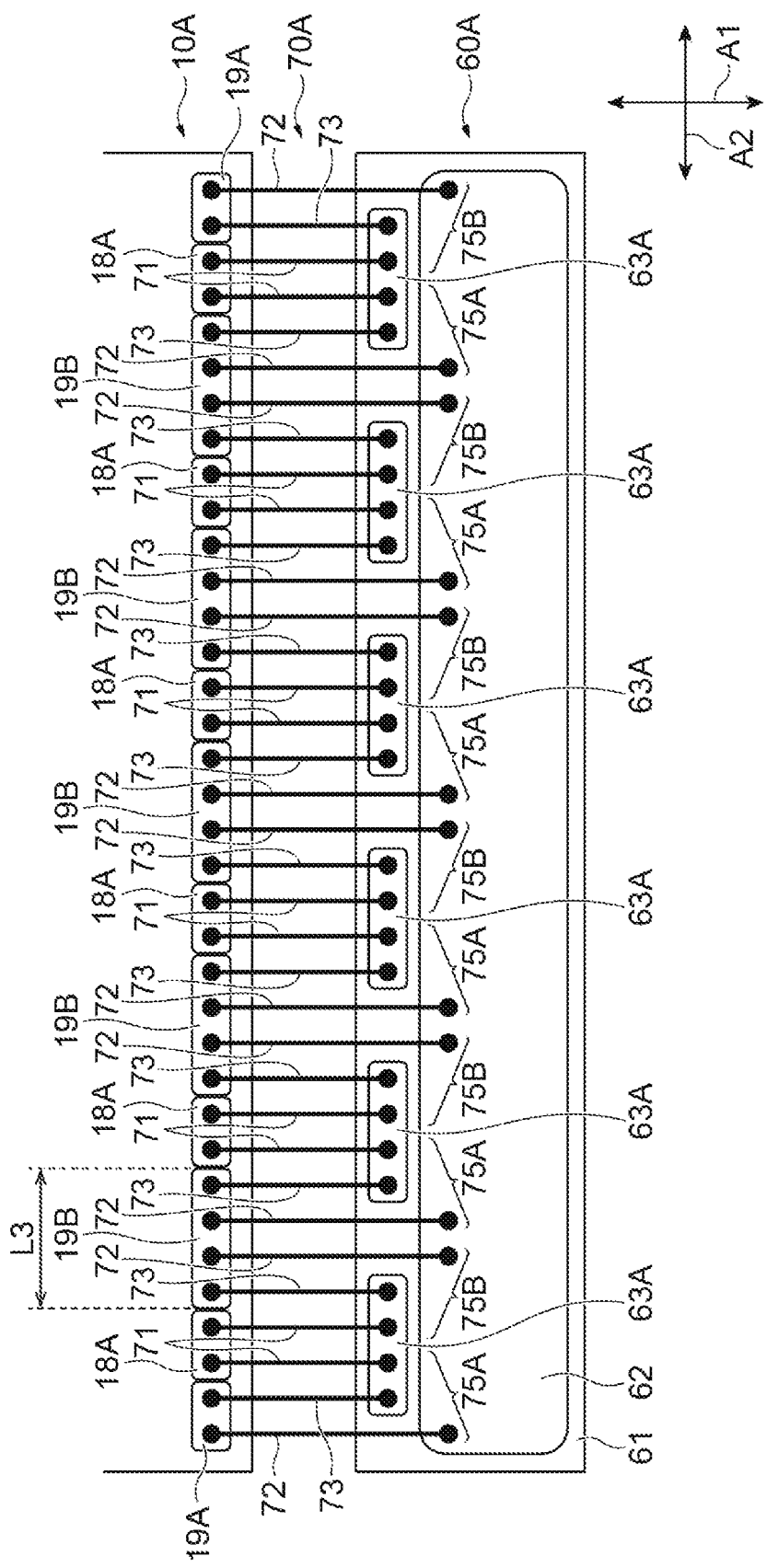
FIG. 7 is a diagram illustrating the semiconductor chip, the capacitor, and the wire of FIG. 6.

FIG. 7 is a plan view illustrating the whole of a semiconductor chip 10A and the capacitor 60A of the semiconductor device according to modified example 1 illustrated in FIG. 6, in second direction A2. As illustrated in FIG. 7, the semiconductor chip 10A according to modified example 1 includes an empty pad 19A and the empty pad 19B. The empty pad 19A is provided at each of both ends of the semiconductor chip 10A in the second direction A2. The shape, size, and function of the empty pad 19A are, for example, the same as those of the empty pad 19 described above. The empty pad 19B is arranged on the center side of the semiconductor chip 10A in the second direction A2 when viewed from the empty pad 19A. The plurality of empty pads 19B are interposed between the pair of empty pads 19A.

In the semiconductor device according to modified example 1, one or two first wires 71 are connected to the drain pad 18A. Two second wires 72 and two third wires 73 are connected to the empty pad 19B, and one or two first wires 71 and one or two third wires 73 are connected to the pad 63A. In the semiconductor device according to modified example 1, the empty pad 19B and the pad 63A are configured as common pads to which a plurality of wires are connected.

The wire group 70A includes a plurality of first sets 75A and a plurality of second sets 75B, and the alignment order of the wires is different between the first set 75A and the second set 75B. The first set 75A and the second set 75B are aligned alternately along, for example, the second direction A2. In the first set 75A, the second wire 72, the third wire 73, and the first wire 71 are arranged so as to be aligned along the second direction A2 in this order. In the second set 75B, the first wire 71, the third wire 73, and the second wire 72 are arranged so as to be aligned along the second direction A2 in this order. As an example, the number of the first set 75A and the number of the second set 75B are six. For example, a length L3 of the empty pad 19B in the second direction A2 and the length of the pad 63A in the second direction A2 are 500 μm.

As described above, the semiconductor device according to modified example 1 includes a plurality of first wires 71 and a plurality of second wires 72. Each of the plurality of first wires 71 adjacent to each other is connected to the common pad 63A. Each of the plurality of second wires 72 adjacent to each other is connected to the common empty pad 19B. Therefore, the pad 63A and the empty pad 19B can be more effectively used as wire connecting portions. Further, the wire length of each wire of the wire group 70A can be further shortened. Since a distance between the wires of the wire group 70A is shortened and mutual inductance is increased, the wire length of each wire can be shortened by the increase in the mutual inductance. Therefore, the possibility of fusing of each wire of the wire group 70A can be further reduced.

Figure 8:
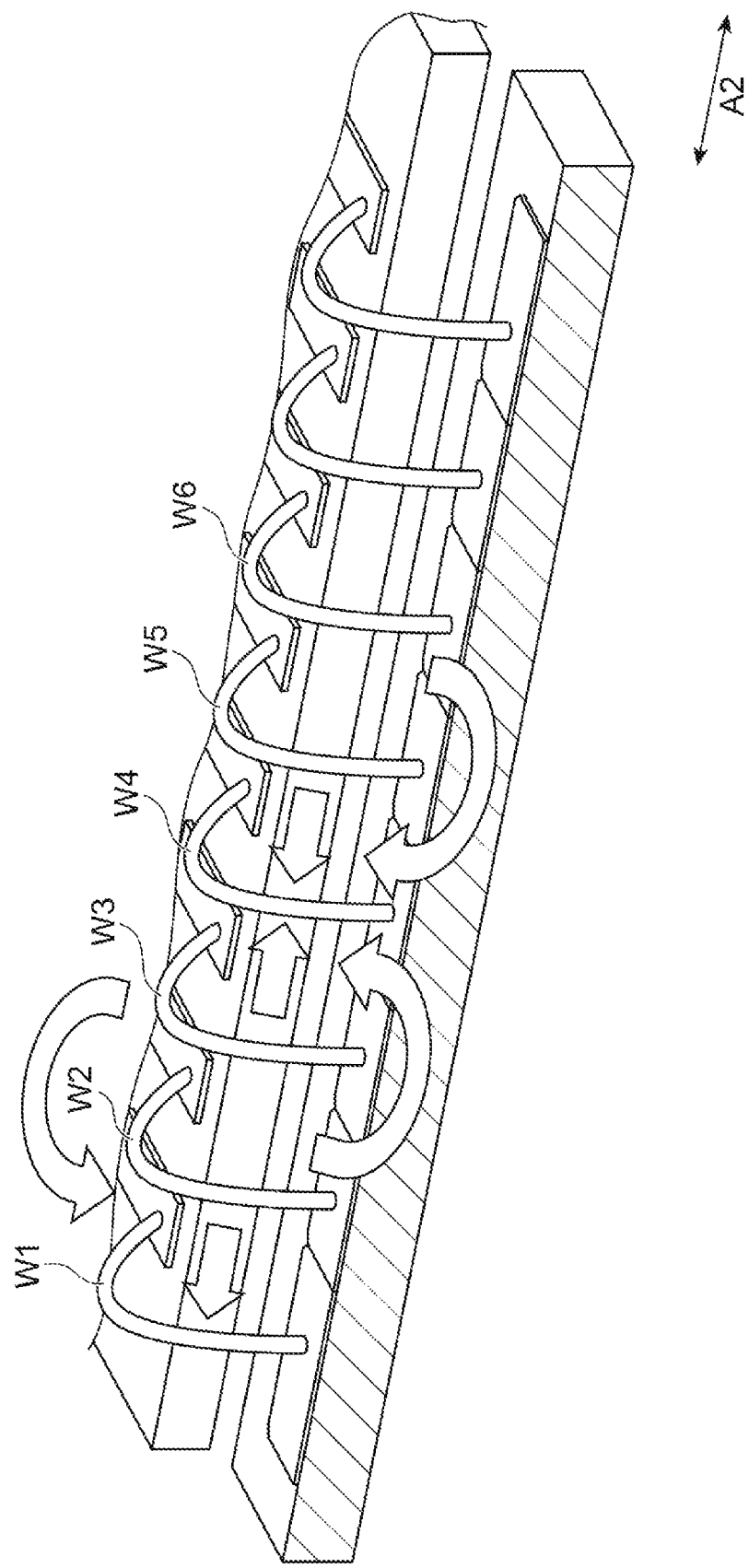
FIG. 8 is an enlarged perspective view of a wire.

More specifically, as illustrated in FIG. 8, a wire W1 located at the end of the second direction A2 is mainly influenced by a one-sided closest wire W2 and a next adjacent wire W3. On the other hand, since a wire W4 is influenced by the wires W2, the wire W3, a wire W5, and a wire W6 on both sides, an effective wire length due to the mutual inductance is greatly changed as compared with the wire W1. When it is assumed that a length of each wire is 1, a radius of each wire is r, a height of each wire from the ground is h, a distance between the wires is d, and magnetic permeability of vacuum is μ0, the mutual inductance is expressed as the following Equation (1).

[Equation 1]

$$M = \mu_c^{1}/4\pi \log((2h-r)^2 + d^2/r^2 + d^2) \qquad (1)$$

From the above Equation (1), the mutual inductance M is proportional to the wire length 1 and becomes larger as the distance d between the wires becomes narrower. Therefore, as the distance between the wires is narrower, the mutual inductance M becomes larger, and thus, the length 1 of the wires can be shortened.

Figure 9:
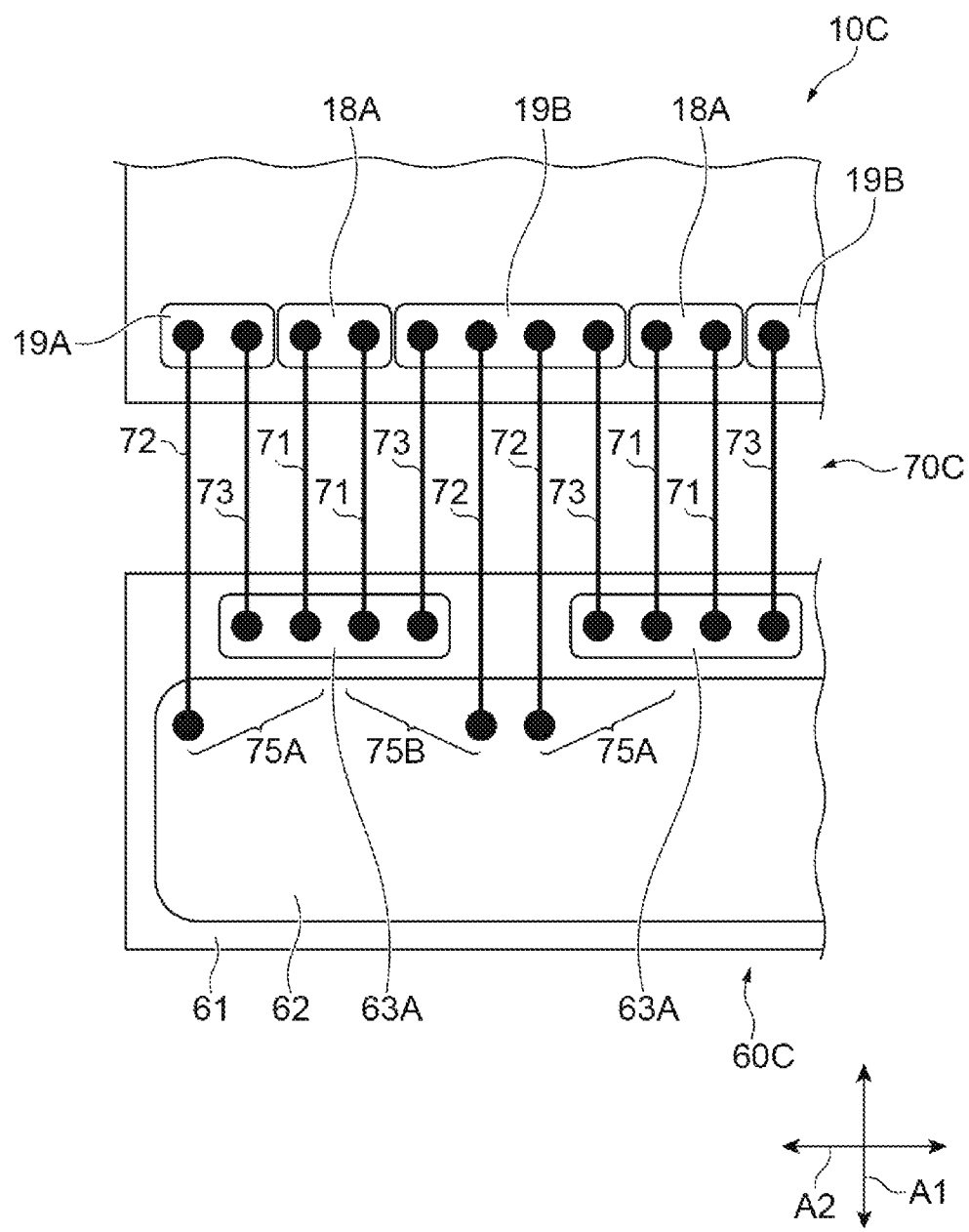
FIG. 9 is a plan view illustrating a semiconductor chip, a capacitor, and a wire of a semiconductor device according to modified example 2.
Figure 10:
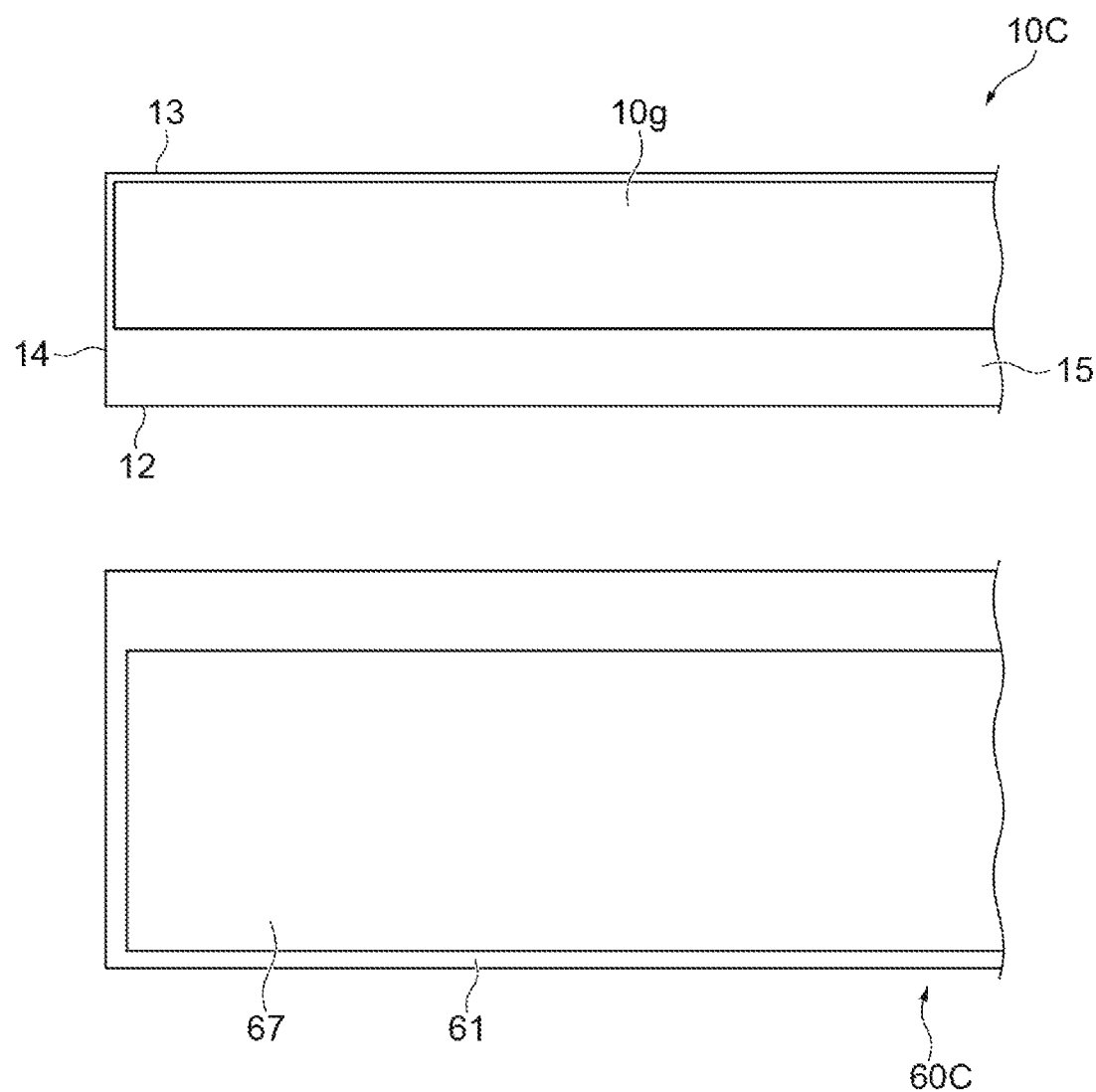
FIG. 10 is a rear view illustrating a back surface of the semiconductor chip and the back surface of the capacitor of FIG. 9.

Subsequently, a semiconductor device according to modified example 2 will be described with reference to FIGS. 9 and 10. FIG. 9 illustrates the surfaces of a semiconductor chip 10C and the surfaces of a capacitor 60C according to modified example 2. FIG. 10 illustrates the back surface of the semiconductor chip 10C and the back surface of the capacitor 60C. The semiconductor chip 10C includes a drain pad 18A, a drain pad 18B, and empty pads 19A and 19B.

In this modified example, the drain pad 18A is provided at each of both ends of the semiconductor chip 10C in the second direction A2. For example, one first wire 71 is connected to the drain pad 18A. Two first wires 71 are connected to the drain pad 18B. Two second wires 72 and two third wires 73 are connected to the empty pad 19B.

The capacitor 60C includes a dielectric 61, an upper electrode 62, a pad 63A, and a pad 63B. The pad 63B is provided at each of both ends of the capacitor 60C in the second direction A2. Two first wires 71 and two third wires 73 are connected to the pad 63A. One first wire 71 and one third wire 73 are connected to the pad 63B. A wire group 70C according to modified example 2 includes a plurality of first sets 75A and a plurality of second sets 75B aligned along the second direction A2. The second set 75B and the first set 75A are alternately aligned along the second direction A2.

The semiconductor chip 10C further includes a back surface electrode 10g, and the capacitor 60C further includes a back surface electrode 67. The back surface electrode 10g has, for example, a rectangular shape along the long side 12, a long side 13, and a short side 14 of the semiconductor chip 10. The back surface electrodes 10g are provided on the back surface of a gate pad 16 and back surface of an active region 17 of the semiconductor chip 10C. The back surface electrode 10g is not provided on the back surface of the drain pads 18A and 18B and the empty pad 19B of the semiconductor chip 10C. That is, the back surface electrodes 10g are deleted from the back sides of the drain pads 18A and 18B and the empty pad 19B in the semiconductor chip 10C.

The back surface electrode 67 of the capacitor 60C is provided on the back surface of the upper electrode 62. The back surface electrode 67 is not provided on the back surfaces of the pads 63A and 63B of the capacitor 60C. That is, the back surface electrodes 67 are deleted from the back sides of the pads 63A and 63B in the capacitor 60C.

As described above, the semiconductor device according to modified example 2 includes the back surface electrode 67 provided on a region other than a region facing the pads 63A and 63B on the back surface of the capacitor 60C. As described above, since the back surface electrodes 67 are not provided on the back surfaces of the pads 63A and 63B, the parasitic capacitance generated in the pads 63A and 63B can be suppressed.

The semiconductor device according to modified example 2 includes a back surface electrode 10g provided on the back surface of the semiconductor chip 10C or the back surface of the board 15 in a region other than a region facing the empty pad 19B. As described above, since the back surface electrode 10g is not provided on the back surface of the empty pad 19B, the parasitic capacitance generated in the empty pad 19B can be suppressed.

Figure 11:
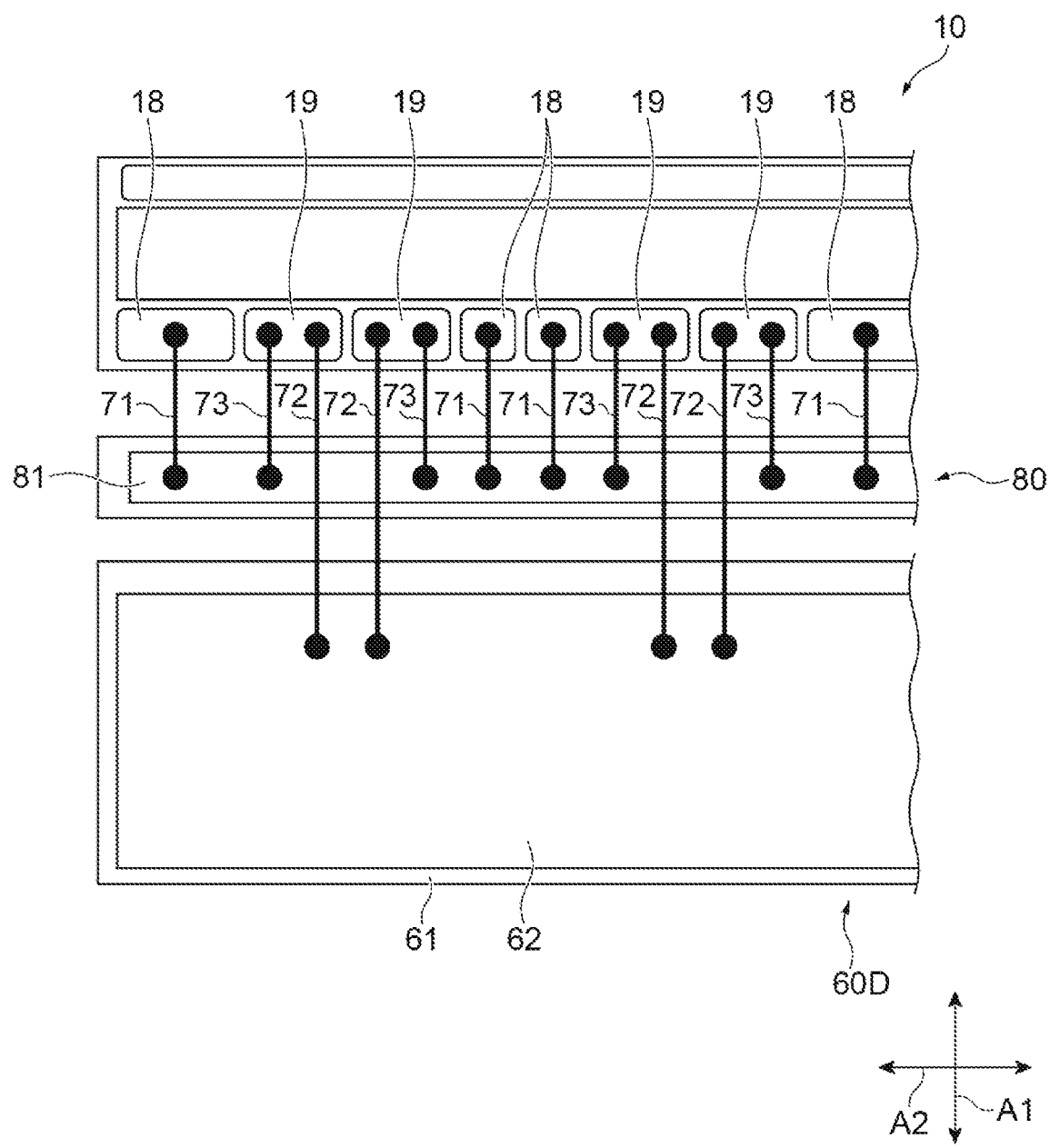
FIG. 11 is a plan view illustrating a semiconductor chip, a first relay pad, a capacitor, and a wire of a semiconductor device according to modified example 3.

Next, a semiconductor device according to modified example 3 will be described with reference to FIG. 11. As illustrated in FIG. 11, the semiconductor device according to modified example 3 includes a semiconductor chip 10, a capacitor 60D, and a relay board 80. The capacitor 60D is different from the above-described capacitor 60 in that capacitor 60D does not have a pad 63. The semiconductor device according to modified example 3 includes a relay pad 81 (first relay pad) provided on the relay board 80 separately from the semiconductor chip 10 and the capacitor 60D instead of the pad 63.

The relay board 80 has a rectangular shape having a long side extending in the second direction A2 and a short side extending in the first direction A1. The relay pad 81 has a rectangular shape having a long side extending along the long side of the relay board 80 and a short side extending along the short side of the relay board 80. A plurality of first wires 71 extending from each of a plurality of drain pads 18 and a plurality of third wires 73 extending from a plurality of empty pads 19 are connected to the relay pad 81.

Heretofore, in the semiconductor device according to modified example 3, the relay pad 81 is provided between the capacitor 60D and the semiconductor chip 10. Therefore, the relay pad 81 can be arranged at a location separated from both the capacitor 60D and the semiconductor chip 10.

Heretofore, the embodiment of the semiconductor device according to the present disclosure has been described above. However, the present invention is not limited to the embodiments or modified examples described above. That is, it is easily recognized by those skilled in the art that the present invention can be modified and changed in various ways without changing the spirit described in the claims. For example, the shape, size, number, material, and arrangement mode of each component of the semiconductor device are not limited to those described above and can be changed as appropriate.

For example, in the above-described embodiment, an example in which the semiconductor chip 10 includes two amplifying elements 11 has been described. However, the number of the amplifying elements 11 may be one or three or more and can be changed as appropriate.

In the above description, an example in which, instead of the pad 63 of the capacitor 60, the relay pad 81 provided on the relay board 80 separately from the semiconductor chip 10 and the capacitor 60D are provided has been described. However, instead of the empty pad 19 of the semiconductor chip 10, the relay pad provided on the relay board separately from the semiconductor chip 10 and the capacitor 60 may be provided. As described above, the relay pad may be provided integrally with the semiconductor chip 10 or the capacitor 60 or may be provided separately. The arrangement mode of the relay pad can be changed as appropriate. The number of the first wires 71, the number of the second wires 72, and the number of the third wires 73, and the arrangement mode can be changed as appropriate.

REFERENCE SIGNS LIST

1: semiconductor device, 2: input terminal, 3: output terminal, 4: package, 4a, 4b: end wall, 4c, 4d: side wall, 4e:

bottom plate, 9a, 9b, 9c, 9e, 9f: bonding wire, 10, 10A, 10C: semiconductor chip, 10b: Ag-Player, 10c: Au layer, 10d: SiC layer, 10f: GaN layer, 10g: back surface electrode, 11: amplifying element, 12: long side (one side), 13: long side, 14: short side, 15: board, 16: gate pad, 17: active region, 18, 18A, 18B: drain pad (electrode pad), 19, 19A, 19B: empty pad (second relay pad), 20: branch circuit board, 21: board, 21a, 21b: long side, 21c, 21d: short side, 22: branch circuit, 23: wiring pattern, 23a: metal pad, 23b: film resistor, 30: synthesizing circuit board, 31: board, 31a, 31b: long side, 31c, 31d: short side, 31e, 31f: corner portion, 32: synthesizing board, 33: wiring pattern, 33a: metal pad, 33b: film resistor, 40: filter circuit, 50: capacitor, 60, 60A, 60C, 60D: capacitor, 60b: Ag-Player, 60c: Au layer, 60d: ceramic layer, 61: dielectric, 62: upper electrode, 63, 63A, 63B: pad (first relay pad), 64: long side (one side), 65: long side, 66: short side, 67: back surface electrode, 70, 70A, 70C: wire group, 71: first wire, 72: second wire, 73: third wire, 75: set, 75A: first set, 75B: second set, 80: relay board, 81: relay pad (first relay pad), A1: first direction, A2: second direction, d: distance, M: mutual inductance, W1, W2, W3, W4, W5, W6: wire.

The invention claimed is:

1. A semiconductor device comprising:
   a semiconductor chip having a transistor and an electrode pad provided on a board;
   a capacitor having an upper electrode and a lower electrode interposing a dielectric;
   a first relay pad;
   a second relay pad provided on the board of the semiconductor chip;
   a first wire connecting the first relay pad and the electrode pad of the semiconductor chip to each other;
   a second wire connecting the second relay pad and the upper electrode of the capacitor to each other; and
   a third wire connecting the first relay pad and the second relay pad to each other,
   wherein a first long side of the semiconductor chip faces a second long side of the capacitor, and the capacitor has a third long side that is parallel to the second long side, and
   wherein the first relay pad is arranged on the second long side and separates the upper electrode from the second long side.

2. The semiconductor device according to claim 1,
   wherein the first relay pad is arranged at a position separated from the upper electrode on the dielectric of the capacitor, and
   wherein the second relay pad is arranged along one side of the semiconductor chip.

3. The semiconductor device according to claim 1,
   wherein the electrode pad is arranged along one side of the semiconductor chip, and
   wherein the second relay pad is arranged adjacent to the electrode pad.

4. The semiconductor device according to claim 1, further comprising:
   a plurality of the first relay pads aligned along one side of the capacitor; and
   a plurality of the second relay pads and a plurality of the electrode pads aligned along one side of the semiconductor chip, and
   wherein each of the plurality of second relay pads is arranged adjacent to the electrode pad.

5. The semiconductor device according to claim 1,
   wherein a plurality of the first wires and a plurality of the second wires are provided,
   wherein each of the plurality of first wires adjacent to each other is connected to the common first relay pad, and
   wherein each of the plurality of second wires adjacent to each other is connected to the common second relay pad.

6. The semiconductor device according to claim 1, further comprising a back surface electrode provided in a region other than a region facing the first relay pad on a back surface of the dielectric of the capacitor.

7. The semiconductor device according to claim 1, further comprising a back surface electrode provided in a region other than a region facing the second relay pad on a back surface of the semiconductor chip or a back surface of the board.

8. The semiconductor device according to claim 1, wherein the first relay pad is provided between the capacitor and the semiconductor chip.

9. The semiconductor device according to claim 1, wherein the board is made of silicon carbide (SiC), diamond, or metal.

* * * * *